United States Patent
Li et al.

(10) Patent No.: US 8,687,417 B2
(45) Date of Patent: Apr. 1, 2014

(54) ELECTRONIC DEVICE AND METHOD OF BIASING

(75) Inventors: Ruigang Li, Austin, TX (US); Jingrong Zhou, Austin, TX (US); David Donggang Wu, Austin, TX (US); Zhonghai Shi, Austin, TX (US); James F. Buller, Austin, TX (US); Mark W. Michael, Cedar Park, TX (US); Donna Michael, legal representative, Cedar Park, TX (US); Akif Sultan, Austin, TX (US); Fred Hause, Austin, TX (US)

(73) Assignee: Globalfoundries Inc.

( * ) Notice: Subject to any disclaimer, the term of this patent is extended or adjusted under 35 U.S.C. 154(b) by 1010 days.

(21) Appl. No.: 11/867,743

(22) Filed: Oct. 5, 2007

(65) Prior Publication Data

US 2009/0090969 A1    Apr. 9, 2009

(51) Int. Cl.
*G11C 11/34* (2006.01)
*G11C 16/04* (2006.01)
*G11C 16/02* (2006.01)
*G11C 16/00* (2006.01)

(52) U.S. Cl.
USPC . 365/184; 365/182; 365/185.28; 365/185.18; 365/185.24

(58) Field of Classification Search
USPC .............. 365/176, 182, 184, 185.18, 185.24, 365/185.28
See application file for complete search history.

(56) References Cited

U.S. PATENT DOCUMENTS

| | | | | |
|---|---|---|---|---|
| 5,488,243 A | * | 1/1996 | Tsuruta et al. | 257/314 |
| 5,751,037 A | * | 5/1998 | Aozasa et al. | 257/321 |
| 5,838,047 A | * | 11/1998 | Yamauchi et al. | 257/372 |
| 6,100,567 A | * | 8/2000 | Burr | 257/365 |
| 6,445,032 B1 | * | 9/2002 | Kumar et al. | 257/321 |
| 2005/0253196 A1 | * | 11/2005 | Yagishita et al. | 257/347 |

* cited by examiner

*Primary Examiner* — J. H. Hur

(57) ABSTRACT

A first bias charge is provided to first bias region at a first level of an electronic device, the first bias region directly underlying a first transistor having a channel region at a second level that is electrically isolated from the first bias region. A voltage threshold of the first transistor is based upon the first bias charge. A second bias charge is provided to second bias region at the first level of an electronic device, the second bias region directly underlying a second transistor having a channel region at a second level that is electrically isolated from the first bias region. A voltage threshold of the second transistor is based upon the second bias charge.

9 Claims, 11 Drawing Sheets

US 8,687,417 B2

ELECTRONIC DEVICE AND METHOD OF BIASING

BACKGROUND

1. Field of the Disclosure

The present disclosure is related to electronic devices, and more particularly to an electronic device having a biasing layer and a method thereof.

2. Description of the Related Art

The voltage threshold of a transistor is the voltage at which a field effect transistor begins to conduct. Transistors with lower threshold voltages tend to switch faster than transistors with higher threshold voltages. However, transistors with lower threshold voltages also tend to have higher amounts of leakage current than transistors with higher voltage thresholds. Therefore, determining a desired threshold voltage of a transistor is generally a tradeoff between transistor speed and transistor leakage for a particular application.

While in bulk semiconductor technology body-biasing techniques can be used to affect transistor threshold voltages, such techniques are impractical with traditional semiconductor-on-insulator substrates. For example, transistors formed at semiconductor-on-insulator substrates have floating bodies, each of which would require a body contact to implement a body-bias. Such body contacts results in increased layout size and parasitics. Therefore, an alternate device and method would be useful.

BRIEF DESCRIPTION OF THE DRAWINGS

The present disclosure may be better understood, and its numerous features and advantages made apparent to those skilled in the art by referencing the accompanying drawings.

DETAILED DESCRIPTION

In accordance with a specific embodiment of the present disclosure, a first bias charge is provided to a first bias region at a first level of an electronic device, the first bias region directly underlying a first transistor having a channel region at a second level that is electrically isolated from the first bias region. A voltage threshold of the first transistor is based upon the first bias charge. A second bias charge is provided to a second bias region at the first level of an electronic device, the second bias region directly underlying a second transistor having a channel region at a second level that is electrically isolated from the first bias region. A voltage threshold of the second transistor is based upon the second bias charge. Specific embodiments of the present disclosure will be better understood with respect to FIGS. 1-13 discussed herein.

Figure 1:
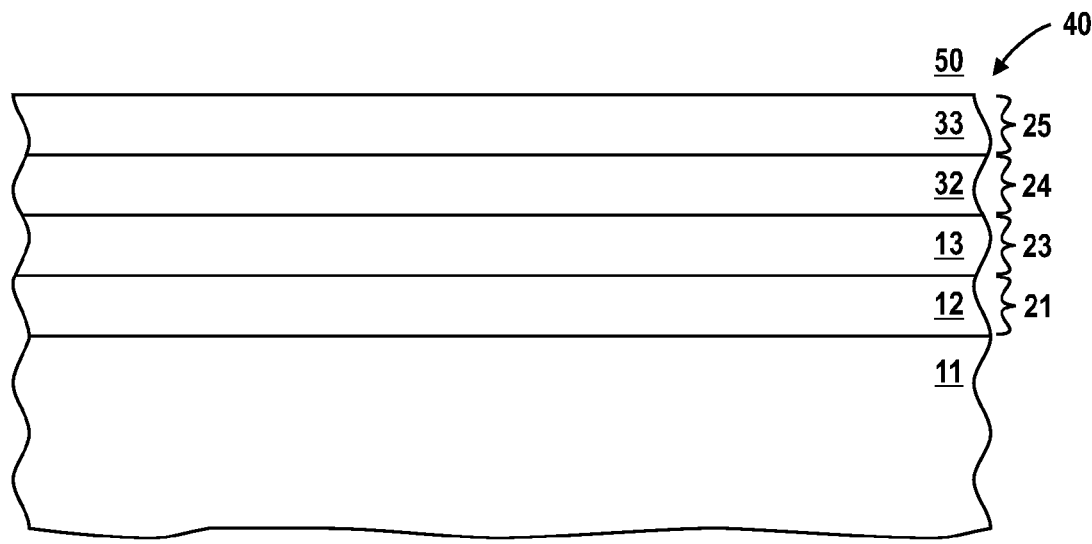
FIG. 1 includes a cross-sectional view of a workpiece comprising a semiconductor-on-insulator substrate.
Figure 2:
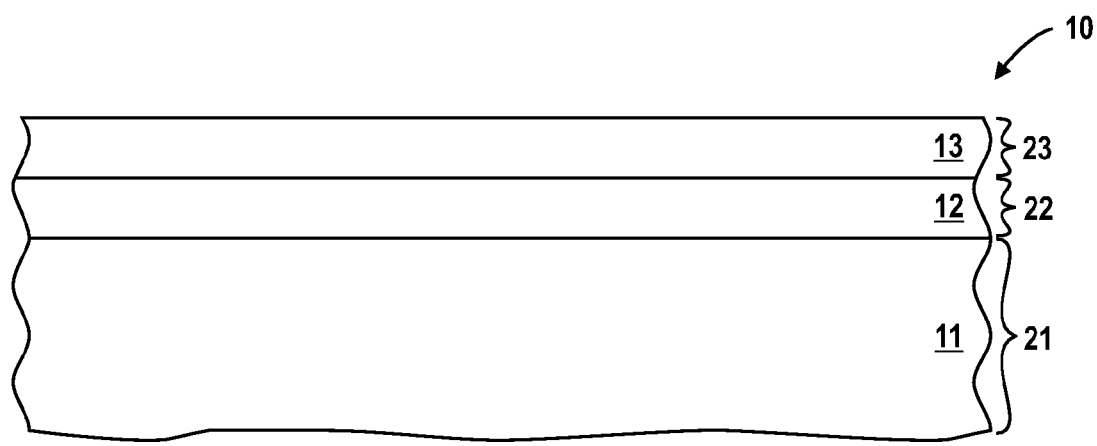
FIG. 2 includes a cross-sectional view of workpiece comprising a semiconductor-on-insulator substrate.
Figure 3:
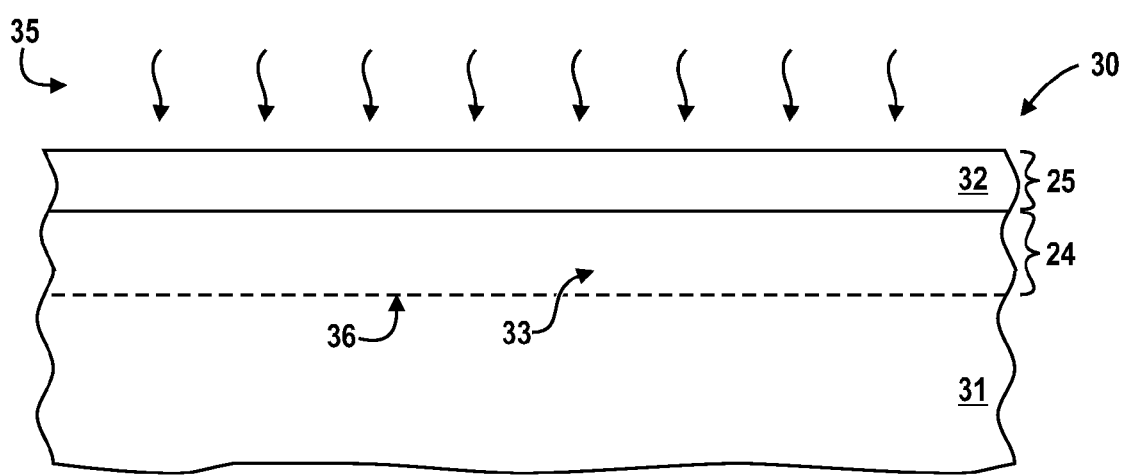
FIG. 3 includes a cross-sectional view of workpiece formed from the combination of the workpiece of FIG. 1 and the workpiece of FIG. 2 in accordance with a specific embodiment of the present disclosure.

FIGS. 1-3 illustrate a specific embodiment of forming a dual-semiconductor-on-insulator (dual-SOI) substrate in accordance with a specific embodiment of the present disclosure. The term "dual-SOI substrate" as used herein refers to a substrate that includes a semiconductor layer overlying a conductive layer and two dielectric layers, wherein the conductive layer is between the two dielectric layers. FIG. 1 illustrates a substrate 40 that is a dual-SOI substrate. The substrate 40 is a compound substrate including a plurality of layers including layers at levels 21-25. Though the layers at levels 21-25 are illustrated as having a similar thickness, it will be appreciated that the actual thickness of each layer can vary relative the other layers. Similarly, various features illustrated in FIGS. 1-13 are not necessarily drawn to scale with respect to other features.

In one embodiment, substrate 40 includes a base layer 11, at a level 21, that that provides structural support to layers formed at overlying levels. Base layer 11 can include: a semiconductor, such as silicon, germanium, carbon, and combinations thereof, or a non-semiconductor that can include conductive or a dielectric material; and combinations thereof. A dielectric layer 12 is formed overlying base layer 11, at level 22. Dielectric layer 12 is a dielectric material that can include: an oxide, such as silicon dioxide; a nitride; and combinations thereof. A layer 13 is formed overlying dielectric layer 12 at level 23. Layer 13 is also referred to herein as a biasing layer, and is formed from a material that can distribute a charge, maintain a charge, and combinations thereof. For example, layer 13 can be a conductive material that includes a semiconductor or a metal, and combinations thereof. Dielectric layer 32 includes a dielectric material that can be the same material or a different material as dielectric layer 12. A semiconductor layer 33 is formed at level 25 overlying dielectric layer 32. Semiconductor layer 33 can include a semiconductor, such as silicon, germanium, carbon, and combinations thereof.

In one embodiment, the thickness of the layer 12 is in the range of 1500-2000 Angstroms, or greater, the thickness of layer 13 is in the range of 1000 Angstroms or greater, the thickness of layer 32 can be in the same range as the thickness of layer 12 or less, such as in the range of 100-200 Angstroms, or 150-200 Angstroms, and the thickness of layer 33 is approximately 500 Angstroms or greater. Substrate 40 can be obtained pre-fabricated from a supplier, or fabricated using one or more other substrates obtained from suppliers, as discussed below.

FIG. 2 represents an SOI substrate 10 comprising layers 11-13 as previously discussed, which can be obtained by a supplier, whereby layer 13 is an active semiconductor layer at which transistors can be formed. Substrate 30 of FIG. 3 illustrates a bulk semiconductor substrate 30 at which a dielectric layer 32 has been formed having a desired thickness. Bulk semiconductor substrate 30 includes a semiconductor, such as, for example silicon, germanium, carbon, or any combinations thereof. Substrate 30 has been subjected to an implantation process 35 to implant ions that define a cleavage plane 36 below dielectric layer 32. A layer of semiconductor material resides between the cleavage plane 36 and layer 32 at a level 43 at which transistors will subsequently be formed. Substrate 10 and substrate 30 can be bonded together through the dielectric layer 32 using conventional bonding processes to form a single substrate that is a compound substrate. Either before or after bonding the substrates together original substrate 30 can be separated, i.e., cleaved, along the cleavage plane 36, to form the upper semiconductor layer 33.

It will be appreciated that substrate 40 can be formed using other processes as well. For example, instead of using a bonding process to combine two substrates, a dual-SOI substrate can be formed at a single SOI substrate whereby a dielectric layer 32 is formed at the top-most semiconductor layer, followed by forming a semiconductor layer overlying the dialectic layer 32. Alternatively, another method of forming the dual-SOI substrate can include a process that forms the upper-most dielectric layer by implanting ions that facilitate formation of upper-most dielectric layer of the dual-SOI substrate. For example, a SIMOX (Separation by Implanted Oxygen) process can be used to implant oxygen at a desired depth below a surface of the bulk wafer to form an intermediate oxide layer between semiconductor layers, such as layer 32 between layer 13 and layer 33.

Figure 4:
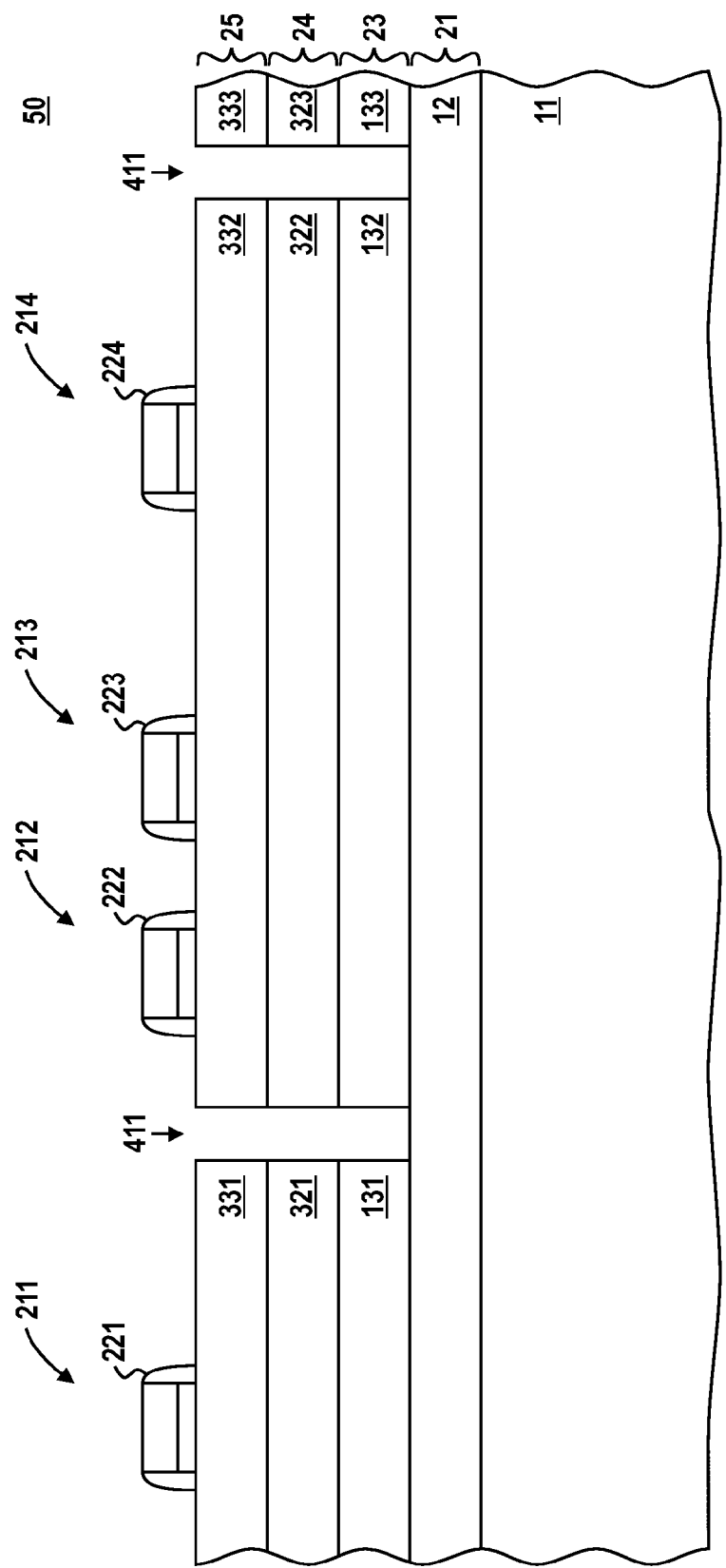
FIG. 4 includes cross-sectional views of a common workpiece after formation of various features in accordance with a specific embodiment of the present disclosure.

FIG. 4 illustrates workpiece 50 after formation of transistor gate structures at transistor locations 211-214. Transistor location 211 includes a gate structure 221 illustrated to include a gate dielectric, a conductive gate, and gate sidewalls. Transistor location 212 includes a gate structure 222 illustrated to include a gate dielectric, a conductive gate, and gate sidewalls. Transistor location 213 includes a gate structure 223 illustrated to include a gate dielectric, a conductive gate, and gate sidewalls. Transistor location 214 includes a gate structure 224 illustrated to include illustrated to include a gate dielectric, a conductive gate, and gate sidewalls.

Also illustrated at FIG. 4 are openings 411 through the layers at levels 23-25. The openings 411 are portions of a trench opening that isolate portions of layers 13, 32, and 33 from other respective portions of those layers. For example, layer 33 is now illustrated to include portions 331-333 that are isolated from each other, layer 32 is now illustrated to include portions 321-323 that are isolated from each other, and layer 13 is now illustrated to include portions 131-132 that are isolated from each other.

Figure 5:
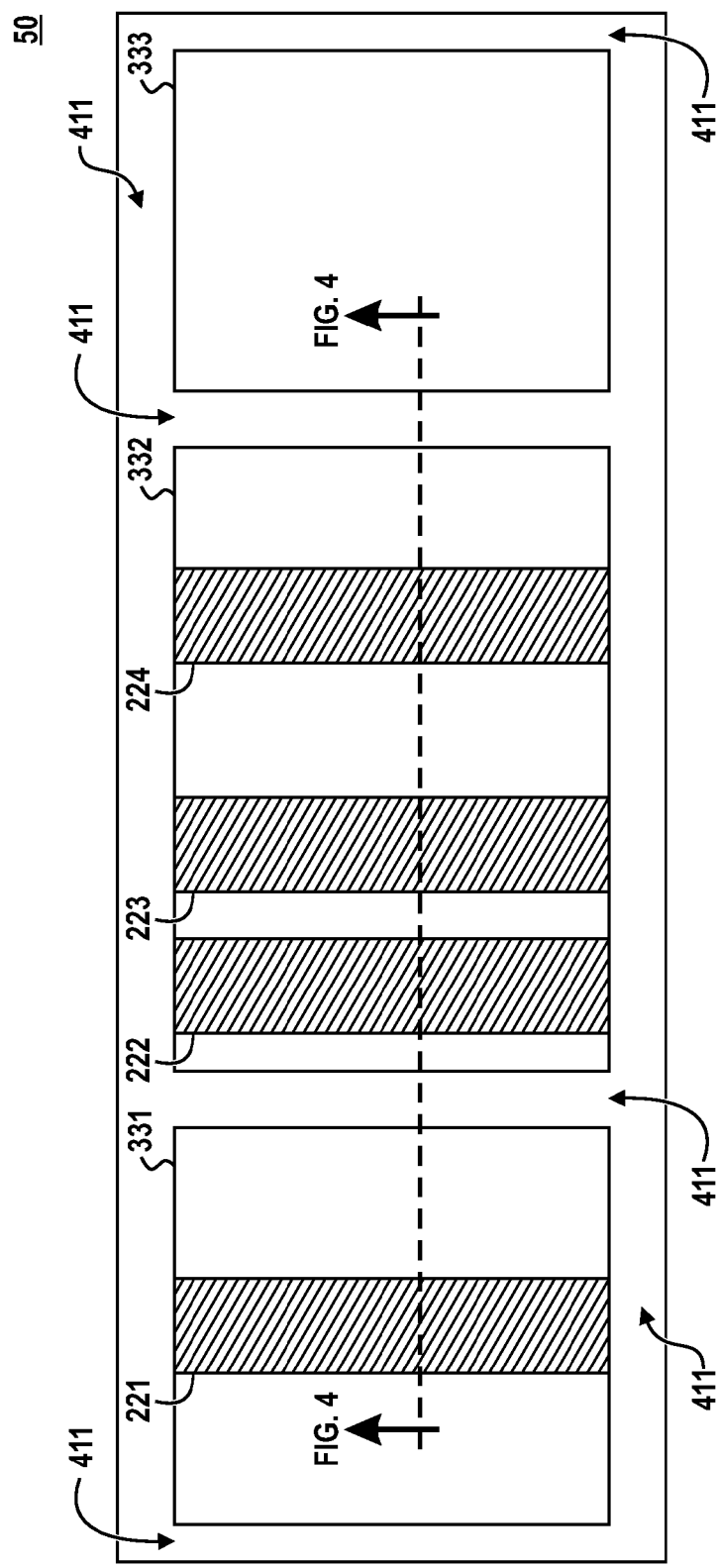
FIG. 5 includes a plan view of the workpiece of FIG. 4 in accordance with a specific embodiment of the present disclosure.

FIG. 5, illustrates a plan view of workpiece 50 that includes the location of the cross sectional view of FIG. 4. The view of FIG. 5 illustrates a trench opening 411 that physically isolates three portions of layer 33 from each other, notably portions 331, 332, and 333 specifically illustrated at FIG. 5.

Referring to FIG. 4, the trench opeing 411 stops at dielectric layer 12, and is formed by removing portions of layers 33, 32, and 13. Trench opening 411 can be formed by etching through each of layers 33, 32, and 13. In one embodiment, a series of etches can be used to form the trench opening 411. A first etch that is preferentially selective to the material of layer 33, such as a semiconductor, relative to the material of layer 32, such as a dielectric, is used to form a first trench portion through layer 33. A second etch that is preferentially selective to the material of layer 33, such as a dielectric, relative to the material of layer 13, such as a semiconductor, is used to form a third trench portion through layer 32. A third etch process that is preferentially selective to the material of layer 13, such as a semiconductor, relative the material of layer 12, such as a dielectric, is used to form a third trench portion through layer 13. The etch process used to form trench opening 411 can be isotropic, non-isotropic, and a combination thereof. The etch process used to form trench opening 411 can include timed etches or etches that detect an end-point condition.

Referring to FIGS. 4 and 5, it is noted that transistor locations 212-214 reside at a common region defined by the perimeter of any one of portions 332, 322, or 132, while transistor location 211 resides at a region defined by the perimeter of any one of portions 331, 321, or 131.

Figure 6:
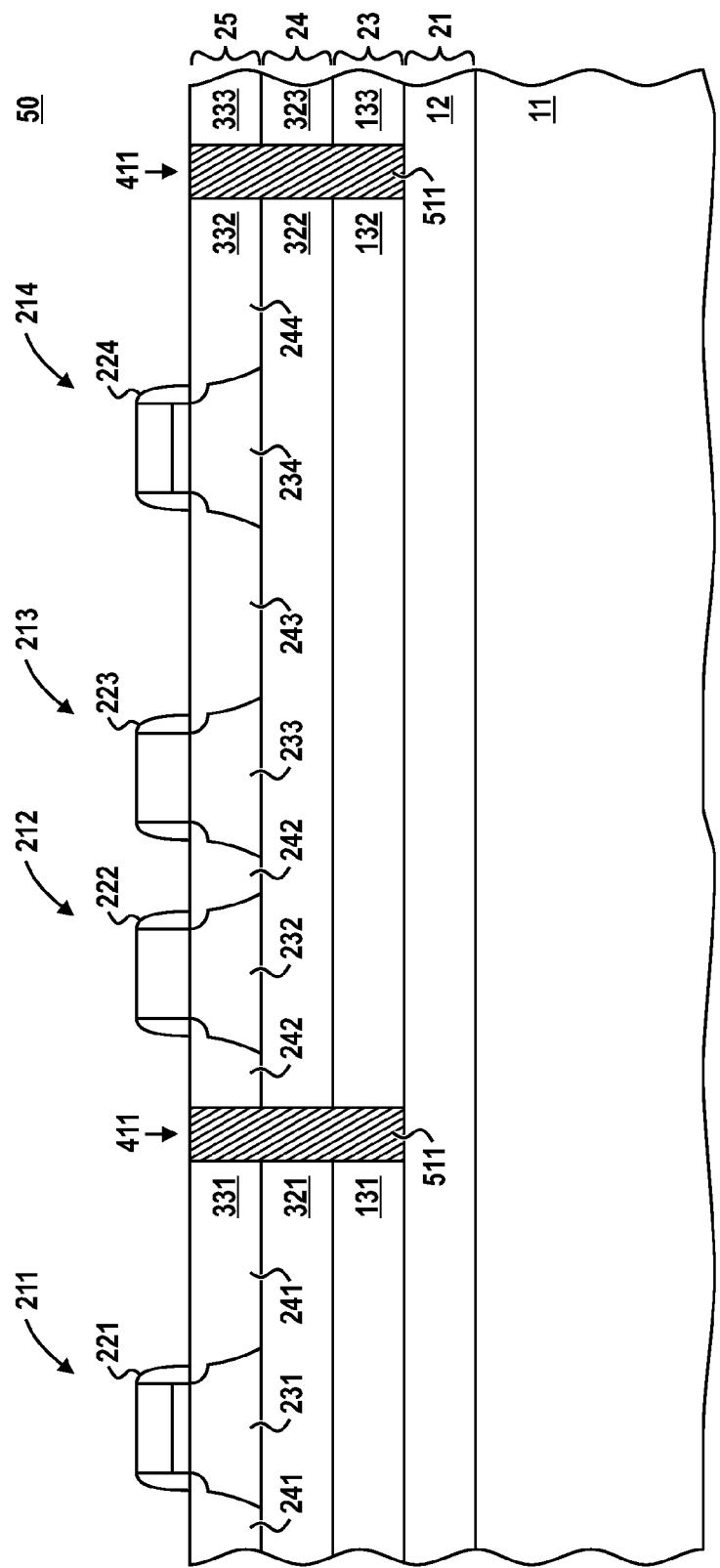
FIG. 6 includes cross-sectional views of a common workpiece after formation of various features in accordance with a specific embodiment of the present disclosure.

FIG. 6 illustrates workpiece 50 after the trench opening 411 has been filled with a dielectric material to form trench 511 that is a dielectric trench, and after source/drain implantation. The dielectric material used to form trench 511 can include any material suitable to electrically isolate portions formed from a common layer, or at a common level from each other. For example, the semiconductor of portion 332 is electrically isolated from the semiconductor of portion 331 by trench 511. Similarly, portion 132 is electrically isolated from portion 131 by the dielectric material used to form trench 511.

Source/drain regions 241-244 have been formed at transistor location 211-214 by a doping process, such as an ion implantation process. Transistor location 211 is illustrated to have source/drain regions 241, and channel region 231. Transistor location 212 is illustrated to have source/drain regions 242, and channel region 232. Transistor location 213 is illustrated to have a source/drain region 242 (shared with transistor location 212), a source/drain region 243, and channel region 233. Transistor location 213, is illustrated to have a source/drain region 243 (shared with transistor location 213), a source/drain region 244, and a channel region 234.

Figure 7:
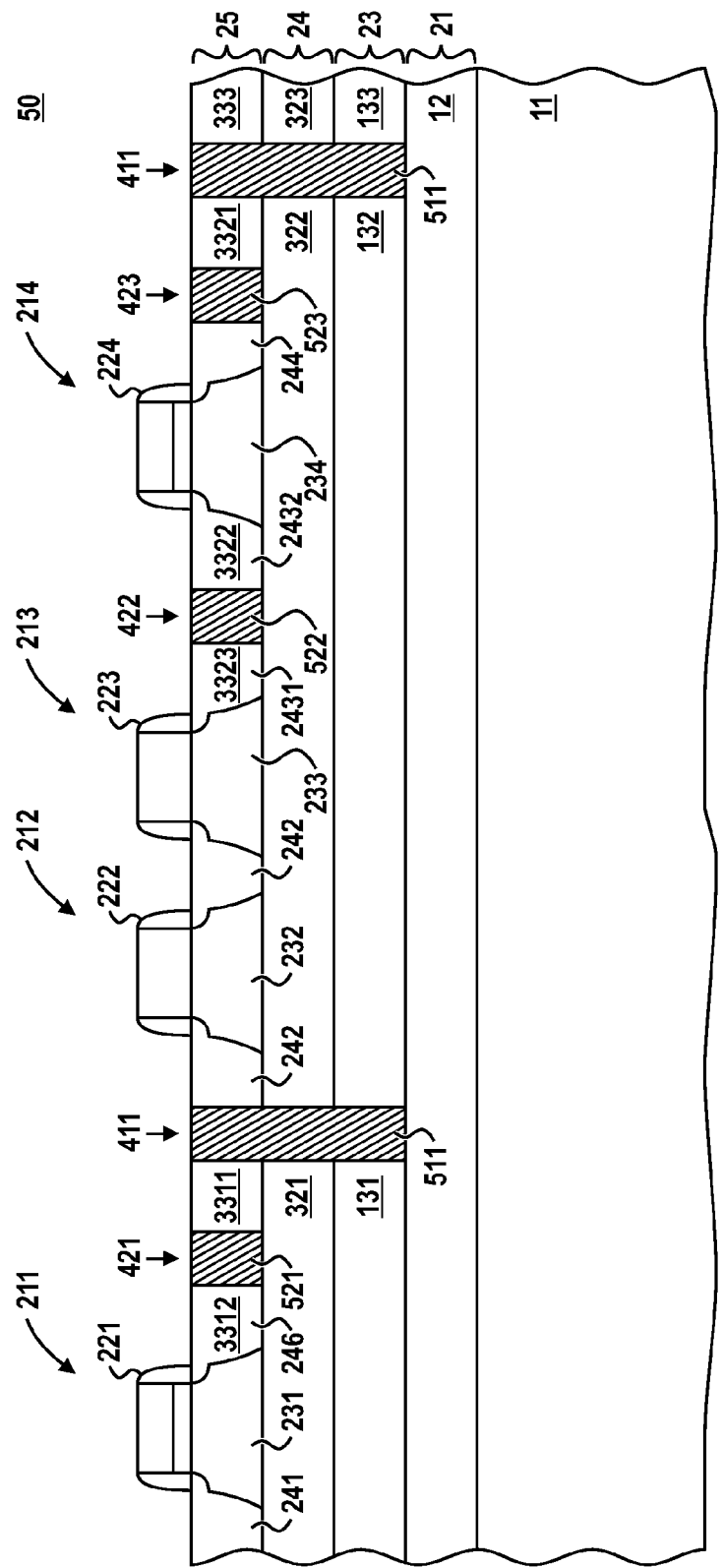
FIG. 7 includes cross-sectional views of a common workpiece after formation of various features in accordance with a specific embodiment of the present disclosure.

FIG. 7 illustrates workpiece 50 after formation of trenches 521-523, which are formed through portions 331 and 332, to form portions 3311, 3312, and 3321-3323. It will be appreciated trenches 521-523 can be formed by first forming openings at the trench locations, which are subsequently filled by an appropriate dielectric material, which can be the same dielectric material or a different dielectric material as that used at trench 511.

The trench 521 electrically isolates semiconductor portion 3311 at level 25 from semiconductor portion 3312 at level 25. The trench 522 electrically isolates semiconductor portion 3323 at level 25 from semiconductor portion 3322 at level 25. The trench 523 electrically isolates semiconductor portion 3322 at level 25 from semiconductor 3321 at level 25. Therefore, transistors at transistor locations 212 and 213 are formed at portion 3323 of semiconductor layer 33, while the transistor 214 is formed at semiconductor portion 3322, that is electrically isolated from active semiconductor region 3323 by trench 522. Thereby facilitating the formation of different active semiconductor regions with respect to each of the different semiconductor portions. Furthermore, each of the transistors at transistor locations 212-214 are formed directly overlying and within the perimeter of portion 132 of layer 32.

Figure 8:
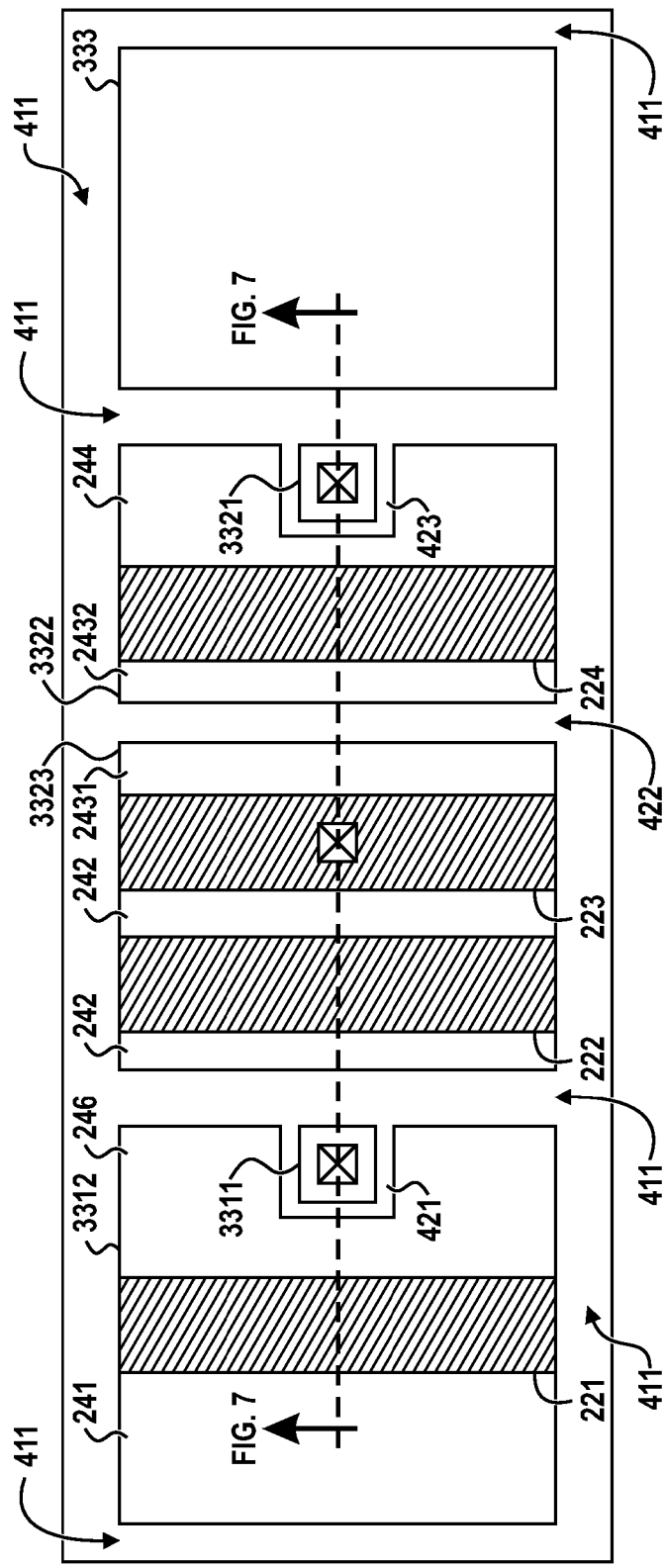
FIG. 8 includes a plan view of the workpiece of FIG. 7 in accordance with a specific embodiment of the present disclosure.

FIG. 8 is a plan view of workpiece 50 of FIG. 7 after formation of trenches 421-423. Note that a continuous trench is formed by trenches 411 and 421-421, and that trench 521 electrically isolates portion 3311 from portion 3312, and trench 522 electrically isolates portion 3323 from portion 3322, and trench 523 electrically isolates portion 3321 from 3322. Also, portion 3331 and portion 3321 each have a contact location represented by a square with an "X" in the center.

Figure 9:
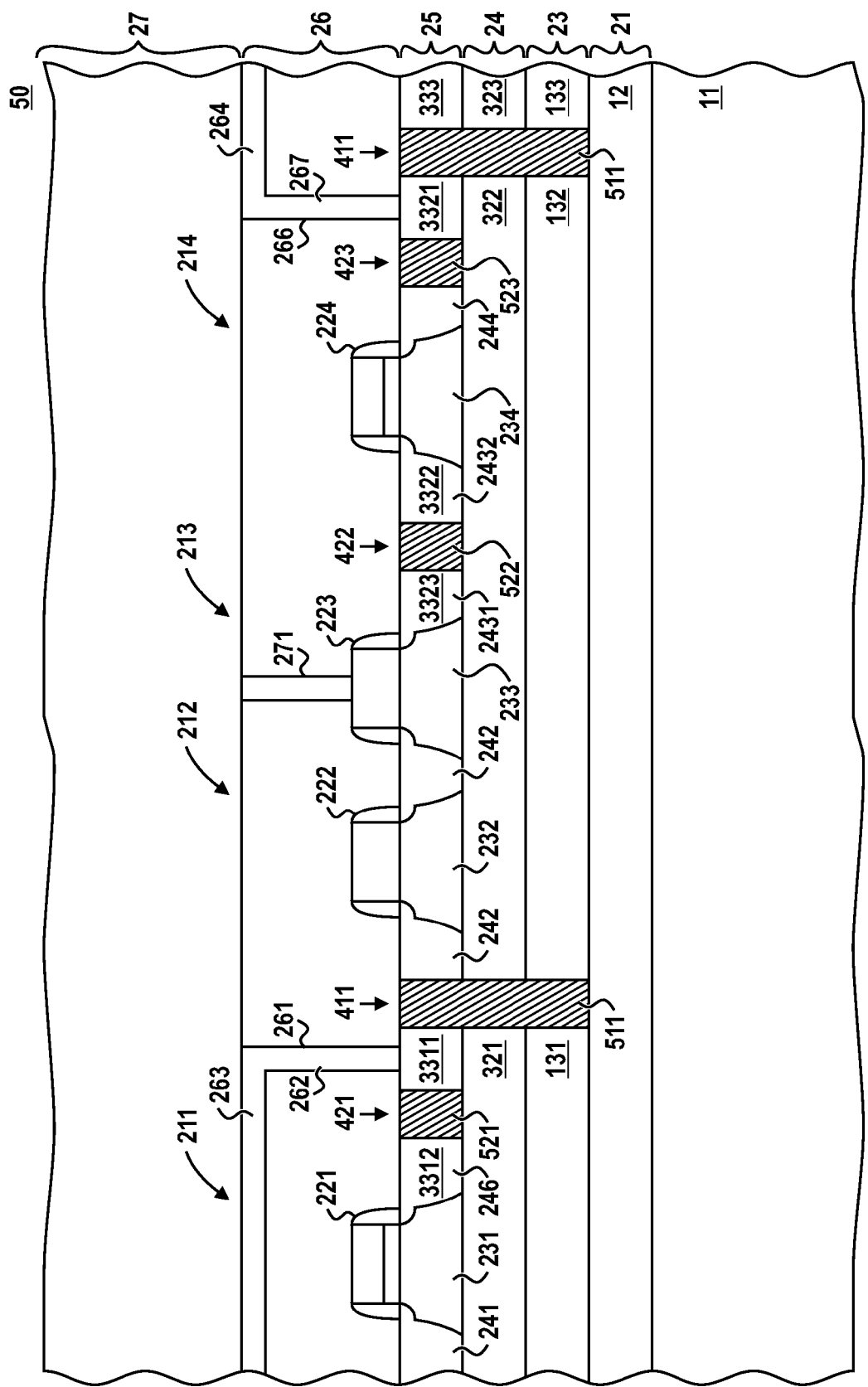
FIG. 9 includes cross-sectional views of a common workpiece after formation of various features in accordance with a specific embodiment of the present disclosure.

These contact locations are location where subsequent contact is made between contact plugs, as illustrated at FIG. 9, at the respective locations. A contact location is also illustrated at gate structure 223.

FIG. 9 illustrates a specific embodiment of workpiece 50 after formation of additional features at levels 26 and 27. At level 26, a first set of interconnects, including interconnects 261, 271, and 266 have been formed. Interconnect 261 includes a horizontal interconnect 263, also referred to as an interconnect line, and a vertical interconnect 262, also referred to as a conductive plug. The conductive plug 262 provides an electrical connection between interconnect line 263 and semiconductor portion 3311. Interconnect 271 is illustrated to include a conductive plug 271 through level 26, and is electrically connected to the conductive gate of gate structure 223. Interconnect 266 includes an interconnect line 264, and a conductive plug 267. The conductive plug 267 provides an electrical connection between interconnect line 264 and portion 3321. Additional interconnect layers can be formed at level 27 as needed to form a completed device. Note that portion 132 is completely surrounded by dielectric material that includes portions of layer 32, layer 12, and dielectric trench 511.

Figure 10:
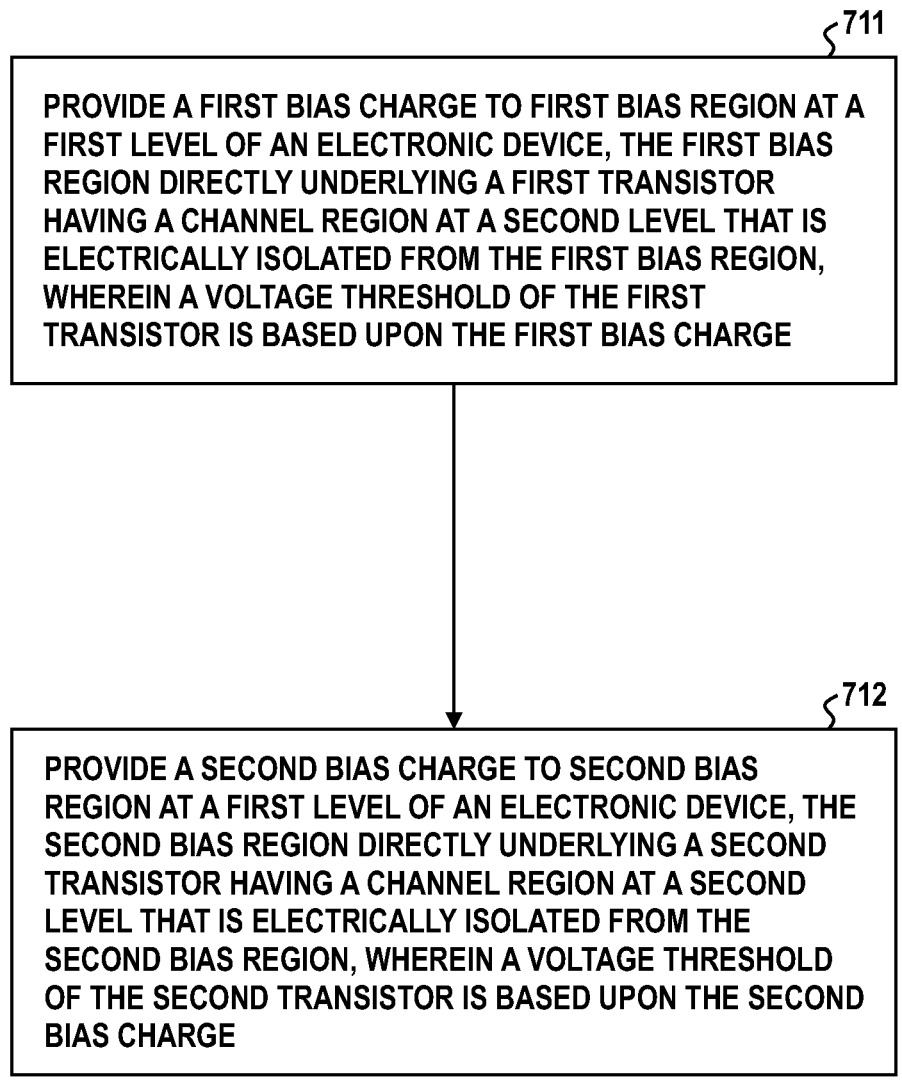
FIG. 10 is a flow diagram in accordance with a specific embodiment of the present disclosure.

FIG. 10 illustrates a flow diagram of a method in accordance with the present disclosure. At 711, a first bias charge is provided to a first bias region at a first level of an electronic device, where the first bias region is directly underlying a first transistor having a channel region at a second level, wherein the channel region is electrically isolated from the first bias region. For example, referring to FIG. 9, the portion 131 represents a bias region that directly underlies the transistor at transistor location 211 that has a channel region 231 at level 25. The term bias region is intended to refer to a region that affects the Vt of a transistor, such as the transistor at transistor location 211. The channel region 231 is further formed at a semiconductor region that is electrically isolated from the bias region 131. The first bias charge is provided to the portion 131 by applying a voltage at interconnect 261, which is in electrical contact with portion 331, whereby the first bias charge is sufficient to cause a charge, such as electrons, to be injected across dielectric 321 to portion 131 at level 23. Note that portion 131 can be a layer of silicon or other material having sufficient conductivity to allow charges within region 131 to migrate throughout bias region 131 to equalize charge distribution.

In one embodiment, to facilitate providing charge across dielectric region, which can be an oxide layer, the thickness of the dielectric portion 3321 is less than 500 Angstroms, such as less than 350 angstroms, and the range of 100-300 Angstroms and a voltage in the range of approximately 7 to 20 volts is applied to interconnect 261 depending upon the thickness of the dielectric portion 321. For example, for a dielectric thickness of approximately 100 Angstroms, the applied voltage can be less than 12 volts, less than 10 volts, and approximately 8 volts. For a dielectric thickness of approximately 200 Angstroms, the applied voltage can be less than 18 volts. The voltage threshold of the transistor at transistor location 211 is based upon the charge provided to bias region formed by portion 131. For example, the Vt of an NMOS transistor can be reduced by providing a negative charge, electrons, to the bias region including portion 131. Therefore, the Vt transistor at transistor location 211 is controllable based upon the amount charge injected to portion 131.

The portion 131, illustrated at FIG. 9, is a non-volatile region. The term non-volatile region refers to a region that maintains, i.e., stores, a provided charge. For example, since portion 131 is completely surrounded by dielectric materials, see FIGS. 8 and 9, once a charge is introduced at portion 131 it will remain. In this manner, the Vt of the transistor at transistor location 211 can be programmed during manufacturing of an electronic device, after formation of the transistor at location 211. For example, charge can be provided at portion 131 as part of a calibration procedure.

At 712, a second bias charge is provided to a second bias region, such as portion 132 of FIG. 9, at the first level of the electronic device, wherein the second bias region is directly underlying a second transistor, e.g., any one of the transistors being formed at locations 212-214, that has a channel region at the second level that is electrically isolated from the second bias region, wherein a voltage threshold of the second transistor is based upon the second bias charge. For example, referring to FIG. 9, the portion 132 directly underlies the transistor at transistor locations 212-214 having channel regions 232-234 at level 25. These transistors are electrically isolated from the portion 132, which is functioning as a bias region. The second bias charge is provided to the bias region 132 by applying a voltage at interconnect 267 that is sufficient to cause a charge, such as electrons, to be provided through semiconductor portion 3321, across dielectric 322 to portion 132 at level 23. Note that portion 132 can be a semiconductor or other material having sufficient conductivity to allow charges within portion 132 to migrate, thereby equalizing charge distribution at the bias region that includes portion 132.

In one embodiment, to facilitate injecting charge across dielectric portion 322, which can be an oxide layer, the thickness of the dielectric portion 322 is the same as dielectric portion 321 and a voltage in the range of 7-20 volts is applied to interconnect 267 when dielectric 321 has a thickness of approximately 100-300 Angstroms. By injecting electrons at portion 132, the channel region of the transistors at transistor locations 212-214 are biased, such that their respective voltage thresholds (Vt) are reduced, assuming the transistors at these locations are NMOS transistors. Therefore, the voltage threshold of the transistors at transistor locations 212-214 are controllable based upon the amount charge injected to layer 132. Layer 132 is part of a bias region that represents a non-volatile region as previously discussed.

Note that transistors at transistor locations 212 and 213 are formed at a common semiconductor region, i.e., portion 3323 of the semiconductor layer 33 at level 25, and that the transistor at transistor location 214 is formed at a different semiconductor region, i.e., portion 3322 of the semiconductor layer 33 at level 25. Therefore, the Vt of transistors at transistor locations 213 and 214 are affected by the same bias charge at portion 132, even though they are formed at different active semiconductor regions.

Figure 11:
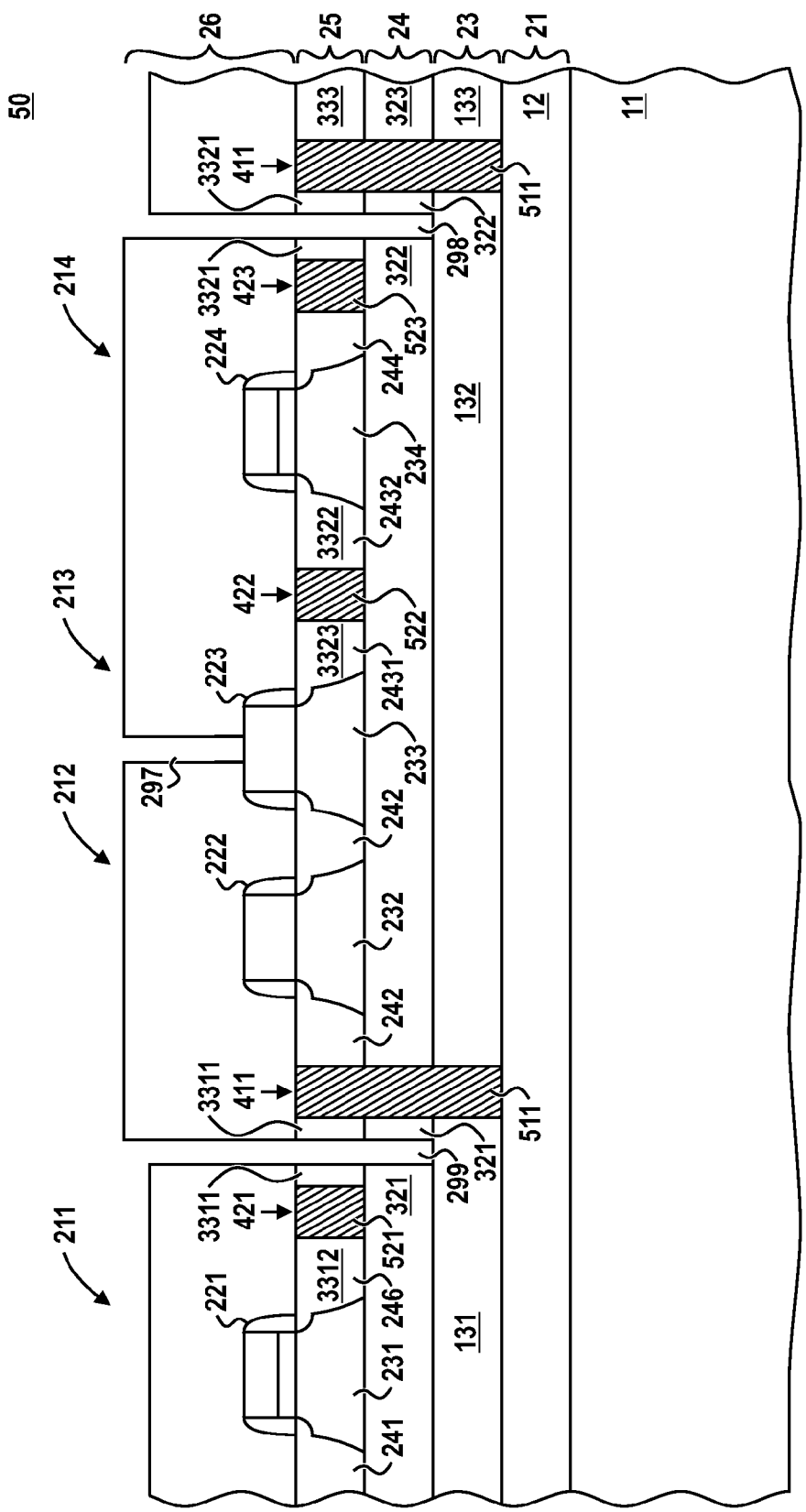
FIGS. 11 and 12 include cross-sectional views of a common workpiece after formation of various features in accordance with an alternate embodiment of the present disclosure.

FIG. 11 illustrates an alternate embodiment of a workpiece 60 that is formed using the same workflow as previously discussed from FIG. 1 through FIG. 7. At FIG. 11, a first interconnect layer is being formed at level 26, whereby interconnect openings 297-299 have been formed at a dielectric at level 26, and at levels 24 and 25.

Figure 12:
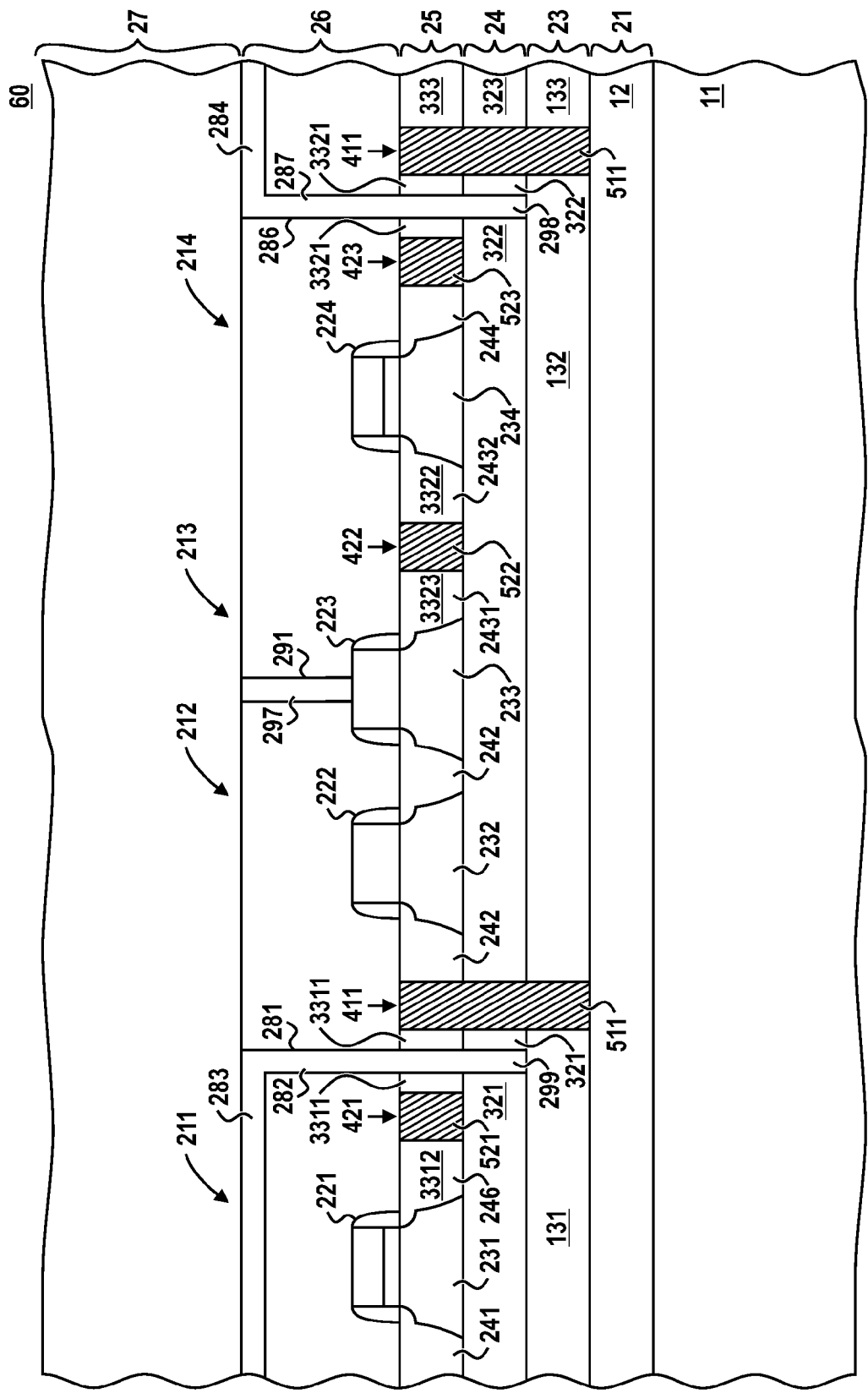
Figure 13:
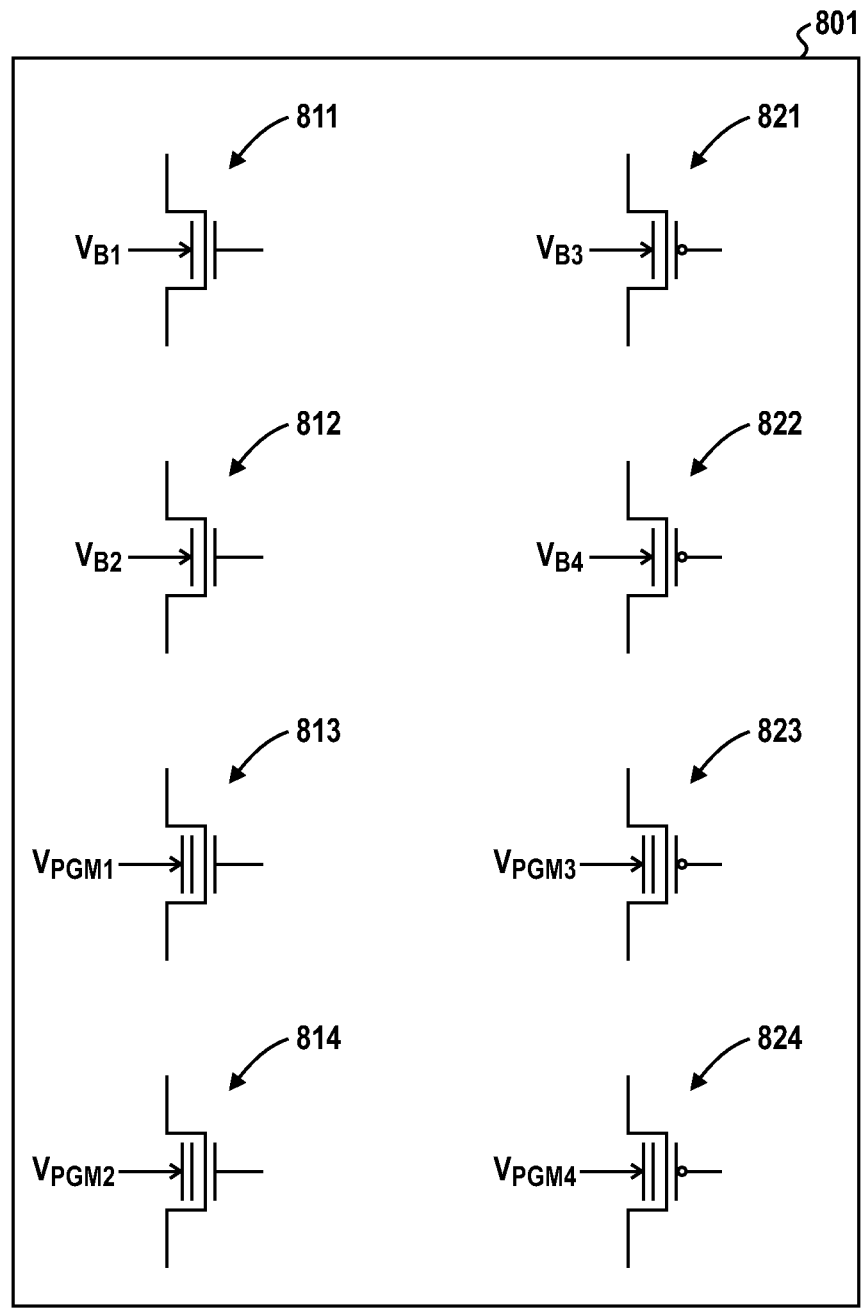
FIG. 13 includes an illustration of transistor devices formed at a common substrate of an electronic device.

FIG. 12 illustrates a specific embodiment of workpiece 60 after completion of levels 26 and 27. At level 26, conductive interconnects have been formed at the openings 297-299 of FIG. 11 to form conductive interconnects. At opening 299 an interconnect 281 has been formed that includes a vertical interconnect portion 282 where a conductive plug has been formed, and a horizontal interconnect portion 283 where a horizontal interconnect has been formed. Similarly, a 286 has been formed at opening 298 that includes a vertical interconnect portion 287 where a conductive plug has been formed, and a horizontal interconnect portion 284 where a horizontal interconnect has been formed. A conductive plug has been formed at opening 291 is illustrated to include only a conductive plug portion.

The conductive plug interconnect 282 aligns with contacts portion 131 to form an electrical contact. Conductive plug interconnect 287 contacts portion 132 to form an electrical contact. Level 27 of FIG. 12 represent where additional interconnect levels have been formed.

Referring back to the flow diagram of FIG. 10, it will be appreciated that with respect the specific implementation of FIG. 12, that the first bias charge at 711 is provided to the bias region 131 by applying a voltage at interconnect 281 that is sufficient to cause a charge, such as electrons, at portion 131. Note that bias region including portion 131 can be a layer of silicon or other material having sufficient conductivity to allow charges within region 131 to migrate, thereby equalizing charge distribution at portion 131. The voltage threshold of the transistor at transistor location 211 is biased upon the charge provided to portion 131. For example, the Vt of an NMOS transistor can be reduced by applying a negative charge, i.e., a positive voltage, to bias region 131. Therefore, the Vt transistor at transistor location 211 is controllable during operation based upon the amount charge injected to layer 131.

The portion 131 illustrated at FIG. 11 is a volatile region. The term volatile region refers to a region that is capable of distributing a charge when a voltage is applied, but is not capable of storing the charge when the voltage is removed. Therefore, the charge at the bias layer is actively maintained. However, since the voltage applied to bias region 131 is directly controllable, the Vt of the transistor at location 211 can be changed during operation, i.e., dynamically controlled, by varying the voltage at interconnect 281. Note that the Vt of any transistor can be changed during operation that overlies a bias region that receives its charge by direct contact with an interconnect. At 712 of FIG. 10, a second bias charge is provided to the bias region 132 by applying a voltage at interconnect 286 that is sufficient to cause a charge, such as electrons, to portion 132 to which it is in electrical contact. Note that portion 132 can be a semiconductor or other material having sufficient conductivity to allow charges within region 132 to migrate, thereby equalizing charge distribution at region 132. Therefore, the voltage thresholds of the transistors at transistor locations 212-214 are controllable based upon the voltage at interconnect 286, which is provided to portion 131 of layer 13. Portion 132 is part of a volatile region as previously discussed.

It will be appreciated that the use of one or more bias regions as described herein can be implemented at a common substrate to affect the Vt of both NMOS and PMOS transistors. For example, referring to FIG. 13, a specific implementation of an electronic device formed at common substrate 801 is illustrated, whereby transistors 811-814 are NMOS transistors and transistors 821-824 are PMOS transistors. Furthermore, transistors 811 and 812 are represented by symbols indicating that they are formed over a volatile bias region of a dual-SOI substrate, wherein the volatile bias region that controls the Vt of transistor 811 is connected to receive a bias voltage labeled Vb1, and the volatile bias region that controls the Vt of transistor 812 is connected to receive a bias voltage labeled Vb2. Transistors 813 and 814 are represented by symbols indicating that they are formed over a non-volatile bias region of a dual-SOI substrate, wherein the non-volatile bias region that controls the Vt of transistor 813 is connected to receive a programming voltage from a signal labeled Vpgm1, while the non-volatile bias region that controls the Vt of transistor 814 is connected to receive a bias voltage from a signal labeled Vpgm2.

Transistors 821 and 822 represent PMOS transistors that are formed over a volatile bias regions as described herein, where the volatile bias region that controls the Vt of transistor 821 is connected to receive a bias voltage labeled Vb3, while the volatile bias region that controls the Vt of transistor 822 is connected to receive a bias voltage labeled Bb4. Transistors 823 and 824 represent transistors that are formed over non-volatile bias regions as described herein, where the non-volatile bias region that controls the Vt of transistor 823 is connected to receive a programming voltage labeled Vpgm3, while the non-volatile bias region that controls the Vt of transistor 824 is connected to receive a bias voltage labeled Bpgm4. It will be appreciated that other electronic devices can use only non-volatile bias regions or only volatile bias regions.

In the foregoing specification, principles of the invention have been described above in connection with specific embodiments. However, one of ordinary skill in the art appreciates that one or more modifications or one or more other changes can be made to any one or more of the embodiments without departing from the scope of the invention as set forth in the claims below. Accordingly, the specification and figures are to be regarded in an illustrative rather than a restrictive sense and any and all such modifications and other changes are intended to be included within the scope of invention.

For example, it will be appreciated unless specifically indicated otherwise that many different embodiments can be used to implement the structures disclosed herein. For example, the relative order of forming various structures, as well as the materials used to form various structures can vary so long as the end device or its operation is consistent with the claims. In addition, the trench openings 421-423 at level 25 can be simultaneously formed with trench opening 411 at level 25, and all of the trenches be filled with dielectric during a common process.

As used herein, the terms "NMOS" and "PMOS" are intended to mean any field effect transistor having an insulated gate regardless of the material from with the gate or insulator is formed. Therefore, the gate material need not include a metal, nor does the insulating material need to include an oxide.

As used herein, the term "substrate" is intended to mean a base material that can be either rigid or flexible and may include one or more layers of one or more materials, which can include, but are not limited to, glass, polymer, metal or ceramic materials or combinations thereof. The reference point for a substrate is the beginning point of a process sequence. The substrate may or may not include electronic components, circuits, or conductive members.

As used herein, the term "electrically isolated" is intended to mean that a significant number of charge carries does not flow through a layer, material, member, or structure.

The term workpiece refers to a substrate and any other features formed at the substrate at any specific point in time, whereby at the beginning of a process, the substrate and workpiece are the same.

What is claimed is:
1. A method comprising:
  providing a first bias charge to a first bias region at a first level of an electronic device, the first bias region being a non-volatile bias region, the first bias region directly underlying a first transistor having a channel region at a second level that is electrically isolated from the first bias region, wherein a voltage threshold of the first transistor is based upon the first bias charge; and providing a second bias charge to a second bias region at the first level of the electronic device, the second bias region being a volatile bias region, the second bias region directly underlying a second transistor having a channel region at the second level, the second level electrically isolated from the second bias region.

2. The method of claim 1, wherein the second bias region directly underlies a third transistor having a channel region at the second level, the second transistor and the third transistor are formed at a common semiconductor region, and wherein a voltage threshold of the second transistor and a voltage threshold of the third transistor is based upon the second bias charge.

3. The method of claim 2 wherein providing the second bias charge further comprises actively maintaining the second bias charge at the second bias region during operation.

4. The method of claim 2 wherein providing the second bias charge further comprises changing the second bias charge at the first bias region during operation.

5. The method of claim 2, wherein providing the first bias charge includes providing the first bias charge through a dielectric layer that resides between the first level and the second level.

6. The method of claim 2, wherein the second bias charge is provided to the second bias region along a path that includes an inter-level interconnect that is in electrical contact with the second bias region.

7. The method of claim 6 wherein providing the second bias charge further comprises changing the second bias charge at the first bias region during operation by changing a voltage at the inter-level interconnect.

8. The method of claim 7, wherein providing the second bias charge further comprises providing the second bias charge to the second bias region overlying a semiconductor base layer spaced apart from the common semiconductor region by a dielectric layer having a thickness of 1500 angstroms or greater.

9. The method of claim 2, wherein providing the second bias charge further comprises providing the second bias charge to the second bias region overlying a semiconductor base layer spaced apart from the common semiconductor region by a dielectric layer having a thickness of 1500 angstroms or greater.

* * * * *